United States Patent [19]

Abe

[11] Patent Number: 4,458,208

[45] Date of Patent: Jul. 3, 1984

[54] PULSE WIDTH MODULATED SIGNAL AMPLIFIER

[75] Inventor: Miki Abe, Yokohama, Japan

[73] Assignee: Sony Corporation, Tokyo, Japan

[21] Appl. No.: 367,213

[22] Filed: Apr. 9, 1982

[30] Foreign Application Priority Data

Apr. 10, 1981 [JP] Japan .................................. 56-54680

[51] Int. Cl.³ ............................................. H03F 3/16
[52] U.S. Cl. ..................................... 330/10; 330/297; 330/110
[58] Field of Search ....................... 330/7, 10, 51, 202, 330/207 A, 110, 293, 297

[56] References Cited

U.S. PATENT DOCUMENTS 3,889,202  6/1975  Suzuki .................. 330/51

Primary Examiner—James B. Mullins
Assistant Examiner—Steven J. Mottola
Attorney, Agent, or Firm—Hill, Van Santen, Steadman & Simpson

[57] ABSTRACT

A pulse width modulated signal amplifier includes a power source, an integrator supplied with an input signal to be pulse-width-modulated and a carrier signal from a carrier signal oscillator, a comparator connected to the output of the integrator for producing a pulse width modulated signal, an output amplifier supplied with a DC voltage from the power source, and a negative feedback circuit connected between the input of the integrator and the output of the output amplifier. The negative feedback circuit becomes effective after a predetermined time from the time when the power source becomes ON so as to avoid the oscillation of the closed loop including the integrator.

14 Claims, 5 Drawing Figures

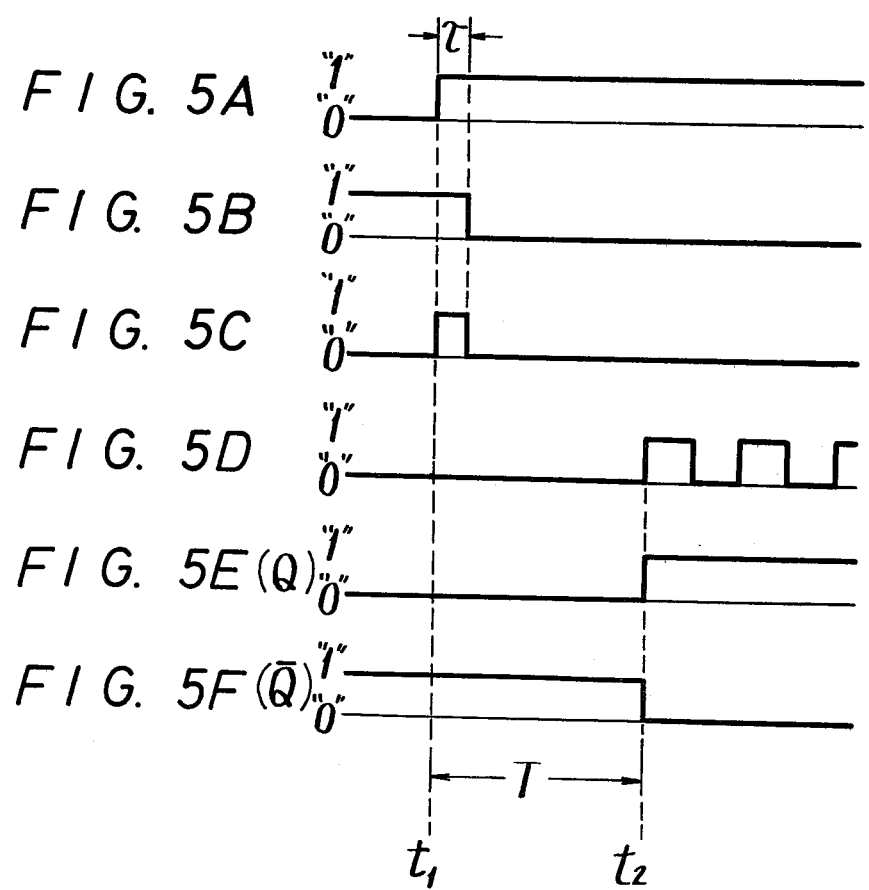

PULSE WIDTH MODULATED SIGNAL AMPLIFIER

BACKGROUND OF THE INVENTION

1. Field of the Invention

The present invention relates generally to a pulse width modulated signal amplifier, and more particularly to a pulse width modulated signal amplifier in which oscillation is prevented from being generated when power is supplied.

2. Description of the Prior Art

A prior art pulse width modulated signal amplifier comprises an amplifier in which the amplitude variation of an audio signal is changed to a variable width pulse (which is a rectangular wave with the frequency of about 500 KHz) and then amplified. Since such amplifier is highly efficient, small in size, light in weight and can produce a large output, it is relatively frequently used.

An example of the prior art pulse width modulated signal amplifier is shown in FIG. 1. In this case, its output signal is fed back to reduce distortion.

In FIG. 1, reference numeral 1 designates an input terminal to which supplied is an audio signal. This audio signal supplied to the input terminal 1 is fed through a series circuit of a capacitor $C_C$ and a resistor $R_I$ to the inverted input terminal of an operational amplifier 2a which forms an integrator 2 and whose non-inverted input terminal is grounded. A carrier signal oscillator 3 is provided which produces a carrier signal such as a rectangular signal with the frequency of, for example, 500 KHz. The carrier signal derived from the oscillator 3 is applied through a resistor $R_O$ to the inverted input terminal of the operational amplifier 2a which has its output connected through a capacitor 2b to its inverted input terminal. At the output side of this operational amplifier 2a there is obtained a signal which is provided by integrating a composite signal of the audio signal and carrier signal and which is in turn supplied to the input side of a comparator 4. This comparator 4 is comprised of, for example, a series circuit of inverters 4a, 4b, 4c and 4d and compares the output signal from the integrator 2 with a reference potential such as ground potential. From the output side of the comparator 4, there provided a signal in which the pulse width of the carrier signal varies in response to the variation of the audio signal, that is, a pulse width modulated signal as shown in FIG. 2.

The pulse width modulated signal from the comparator 4 is supplied through a first drive circuit 5p to the gate of a p-channel MOS field effect transistor (which will be hereinafter referred to simply as a MOS FET), which forms a C-MOS inverter 6 or an output amplifier, and also through a second drive circuit 5n to the gate of an n-channel MOS FET 6n, which forms the C-MOS inverter 6 together with the p-channel MOS FET 6p.

The source of the MOS FET 6p is connected to a power source terminal 7p which is supplied with a positive DC voltage $+V_{CC}$, while the source of the MOS FET 6n is connected to a power source terminal 7n which is supplied with a negative DC voltage $-V_{CC}$. The drains of the MOS FETs 6p and 6n are connected together. The signal obtained at this connection point is fed back through a negative feedback resistor 9 to the inverted input terminal of the operational amplifier 2a forming the integrator 2 to thereby reduce the distortion. An output terminal 8 is led out from the connection point of the drains of the MOS FETs 6p and 6n.

With the prior art example shown in FIG. 1, during the period when the pulse width modulated signal shown in FIG. 2 is negative, the MOS FET 6p turns ON, while during the period where the pulse width modulated signal is positive, the MOS FET 6n turns ON. Thus, at the connection point of the drains of the MOS FETs 6p and 6n, namely output terminal 8, there is obtained the amplified pulse width modulated signal. The pulse width modulated signal thus amplified and derived is demodulated through a low pass filter (not shown) and then if the demodulated signal is fed to, for example, a speaker (not shown), good sound will be reproduced.

According to the prior art pulse width modulated amplifier shown in FIG. 1, before the carrier signal oscillator 3 operates normally when power is applied, the closed loop including the integrator 2 is self-oscillated at the frequency of several MHz to several ten MHz, which frequently results in the generation of pop noises. The reason of this phenomenon is that when the power supply is turned on the output signal from the C-MOS inverter 6 forming the output amplifier is unstable and the output signal therefrom which must be negatively fed back to the integrator 2 is inherently, substantially positively fed back.

OBJECTS AND SUMMARY OF THE INVENTION

Accordingly, it is an object of the present invention to provide a novel pulse width modulated signal amplifier free from the defects encountered in the prior art.

It is another object of the invention to provide a pulse width modulated signal amplifier in which when the power is supplied no oscillation is generated and hence noise generation is avoided.

In accordance with one example of the invention, a pulse width modulated signal amplifier is disclosed which includes:

- a power source for supplying a DC voltage;
- an input terminal for receiving an input signal to be pulse-width-modulated;
- an integrator having input and output terminals;
- a carrier signal oscillator for supplying a carrier signal;
- a circuit for supplying the input signal and the carrier signal to the input terminal of the integrator;
- a comparator having input and output terminals the input terminal of which is connected to the output terminal of the integrator and the output terminal of which produces a pulse width modulated signal;
- an output amplifier supplied with a DC voltage from the power source and having input and output terminals the input terminal of which is connected to the output terminal of the comparator and the output terminal of which produces an amplified pulse width modulated signal; and
- a negative feed back circuit connected between the input terminal of the integrator and the output terminal of the output amplifier and including a series connection of a feedback impedance and a first switch, the first switch being closed after a predetermined time from the time when the DC voltage from the power source is supplied to the output amplifier so as not to produce oscillation.

The other objects, features and advantages of the present invention will become apparent from the following description taken in conjunction with the accompanying drawings through which the like references designate the same elements and parts.

BRIEF DESCRIPTION OF THE DRAWINGS

FIGS. 5A to 5F are respectively waveform diagrams used to explain the operation of the invention.

DESCRIPTION OF THE PREFERRED EMBODIMENT

Figure 1:
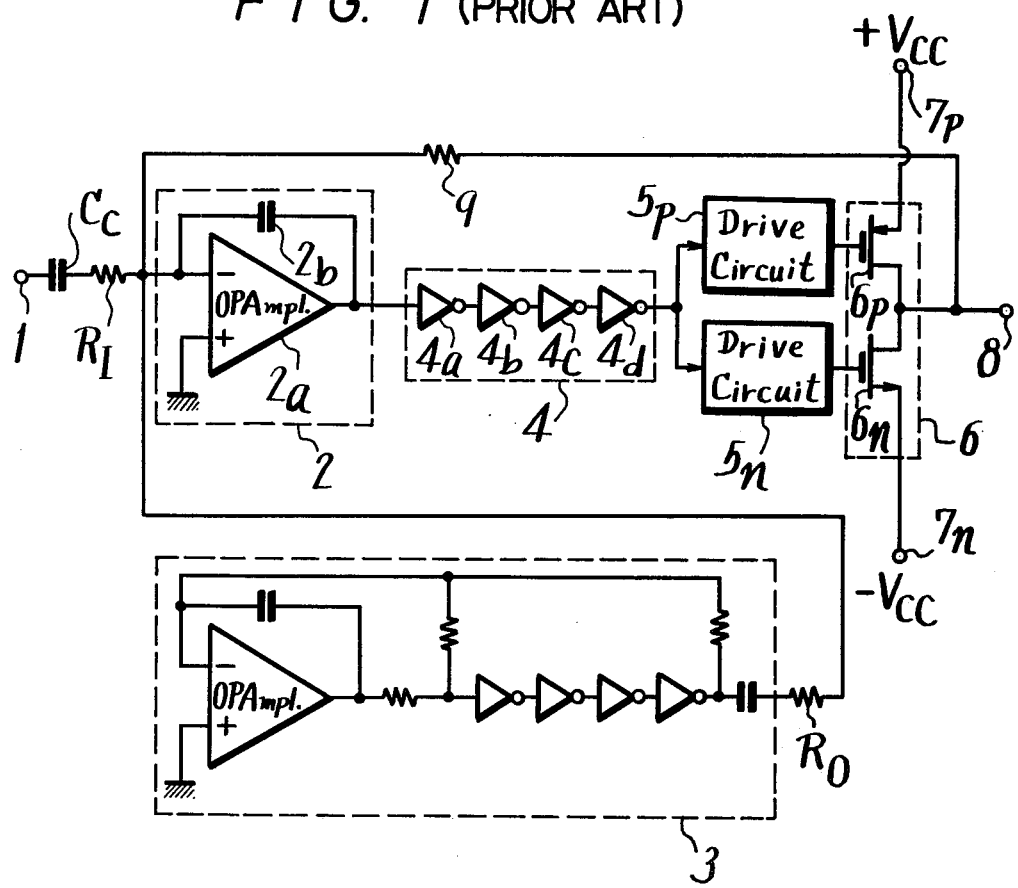
FIG. 1 is a block diagram showing an example of the prior art pulse width modulated signal amplifier.
Figure 2:
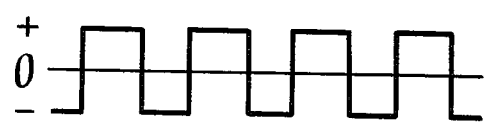
FIG. 2 is a waveform diagram of the output signal from the amplifier shown in FIG. 1.

An example of the pulse width modulated signal amplifier according to the present invention will be described with reference to FIG. 3 in which the parts and elements corresponding to those of FIG. 1 are marked with the same reference numerals and the detailed explanation thereof will be omitted.

Figure 3:
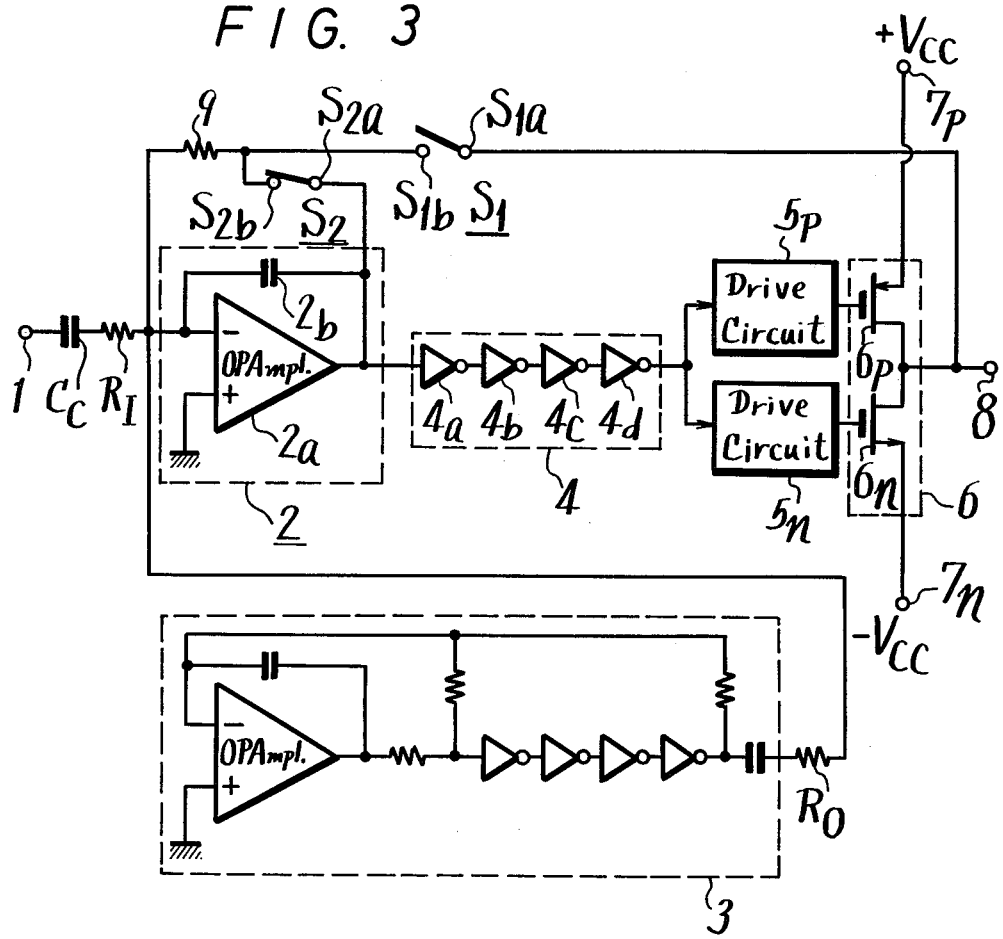
FIG. 3 is a block diagram showing an example of the pulse width modulated signal amplifier according to the present invention.

In the example of the invention shown in FIG. 3, the connection point of the drains of the MOS FETs 6p and 6n, which form the C-MOS inverter 6, is connected to one terminal S1a of a connection switch S1 which has the other terminal S1b connected through the resistor 9 to the inverted input terminal of the operational amplifier 2a forming the integrator 2. The output side of the operational amplifier 2a is connected to one terminal S2a of a connection switch S2 which has the other terminal S2b connected to the connection point between the connection switch S1 and the resistor 9.

Figure 4:
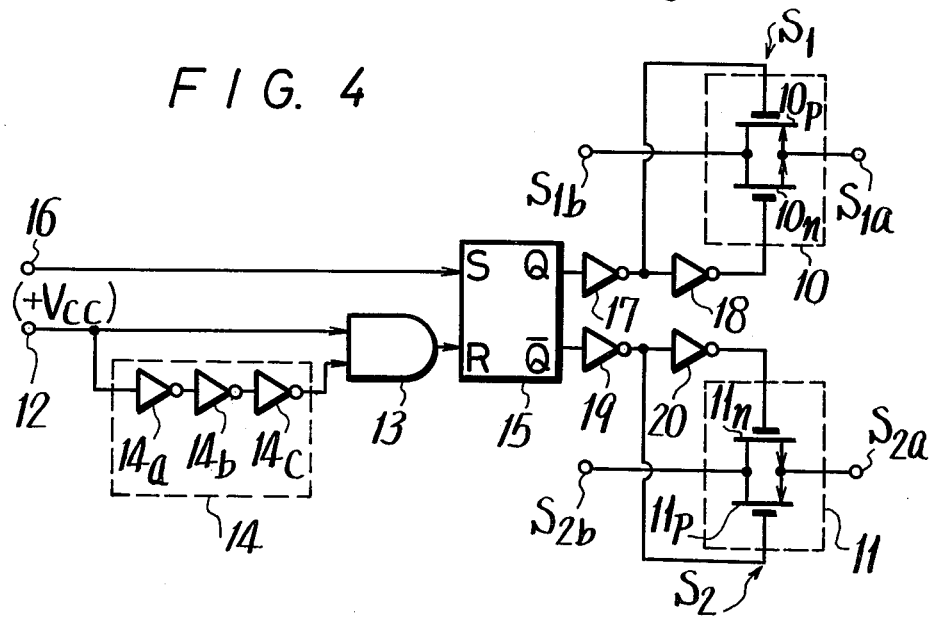
FIG. 4 is a connection diagram showing a transfer gate circuit and its control circuit which are used in the invention.

The respective connection switches S1 and S2 are practically formed of transfer gate circuits as shown in FIG. 4. That is, the connection switch S1 is formed of a transfer gate circuit 10 which consists of a p-channel MOS FET 10p and an n-channel MOS FET 10n. The sources of the MOS FETs 10p and 10n are connected together to serve as one terminal S1a of the connection switch S1, while the drains of the MOS FETs 10p and 10n are connected each other to serve as the other terminal S1b of the connection switch S1. With this transfer gate circuit 10, when the respective gates of the MOS FETs 10p and 10n are supplied with a low level signal "0" such as $-V_{CC}$ and a high level signal "1" such as $+V_{CC}$, the transfer gate circuit 10 becomes conductive.

The connection switch S2 is made of a transfer gate circuit 11 which is formed of a p-channel MOS FET 11p and an n-channel MOS FET 11n. The sources of the MOS FETs 11p and 11n are connected together to provide one terminal S2a of the connection switch S2, while the drains of the MOS FETs 11p and 11n are connected together to serve as the other terminal S2b of the connection switch S2. When the respective gates of the MOS FETs 11p and 11n are supplied with a low level signal "0", for example, $-V_{CC}$ and a high level "1" such as $+V_{CC}$, the transfer gate circuit 11 becomes conductive.

In FIG. 4, reference numeral 12 designates a terminal which is supplied with the high level signal "1" such as $+V_{CC}$ at the same time when power is applied. The signal supplied to the terminal 12 is fed to one input side of an AND circuit 13 and also to the input side of a delay circuit 14 consisting of serially connected inverters 14a, 14b and 14c. The signal delayed by $\tau$ (refer to FIG. 5) and phase-inverted through the delay circuit 14 is fed to the other input of the AND circuit 13. The output signal from the AND circuit 13 is applied to a reset signal input terminal R of a flip-flop circuit 15.

In FIG. 4, reference numeral 16 is a terminal to which the output signal from the C-MOS inverter 6 is applied. The output signal from the C-MOS inverter 6 is supplied through the terminal 16 to a set signal input terminal S of the flip-flop circuit 15.

At the rising-up edges of the signals applied to the set and reset signal input terminals S and R of the flip-flop circuit 15, it is set (which means that a high level signal "1" such as $+V_{CC}$ is obtained at an output terminal Q of the flip-flop circuit 15 and a low level signal "0" such as $-V_{CC}$ at an inverted output terminal $\overline{Q}$) and also reset (which will mean that the low level signal "0" is produced at the output terminal Q and the high level signal "1" is obtained at the inverted output terminal $\overline{Q}$).

The output terminal Q of the flip-flop circuit 15 is connected through an inverter 17 to the gate of the MOS FET 10p of the transfer gate circuit 10 forming the connection switch S1 and also through a series circuit of inverters 17 and 18 to the gate of the MOS FET 10n of the transfer gate circuit 10. While, the inverted output terminal $\overline{Q}$ of the flip-flop circuit 15 is connected through an inverter 19 to the gate of the MOS FET 11p of the transfer gate circuit 11 forming the connection switch S2 and also through a series connection of inverters 19 and 20 to the gate of the MOS FET 11n of the transfer gate circuit 11.

The operation of the circuit of the invention constructed as above will be explained with reference to FIGS. 5A to 5F.

When power is applied to the circuit at a time $t_1$, the signal applied to the terminal 12 becomes the high level signal "1" from the time $t_1$ as shown in FIG. 5A, so that the output signal from the inverter 14c becomes as shown in FIG. 5B. Therefore, the AND circuit 13 produces an output signal shown in FIG. 5C and supplies the same to the reset signal input terminal R of the flip-flop circuit 15. Thus, the flip-flop circuit 15 is reset at the time $t_1$, namely is made to be in such a state that the low level signal "0" such as $-V_{CC}$ is derived at the output terminal Q thereof and the high level signal "1", for example, $+V_{CC}$ is obtained at its inverted output terminal $\overline{Q}$.

At this time, since the gates of the MOS FETs 10p and 10n of the transfer gate circuit 10, which forms the connection switch S1, are supplied with the high level signal "1" and the low level signal "0", respectively, the transfer gate circuit 10 is not made conductive, that is, the connection switch S1 is in non-conductive or disconnected state. While, at this time the gates of the MOS FETs 11p and 11n of the transfer gate circuit 11, which makes up the connection switch S2, are supplied with the low level signal "0" and the high level signal "1" so that the transfer gate circuit 11 becomes the conductive state or connected state, that is, the connection switch S2 becomes the conductive or connected state.

As set forth, since at the time $t_1$ the connection switch S1 is in non-conductive state but the connection switch S2 is in conductive state, the output side of the operational amplifier 2a forming the integrator 2 is connected through the resistor 9 to its inverted input terminal to thereby apply a local feedback thereto. Accordingly, in accordance with the operation of the carrier signal oscillator 3, the integrator 2, comparator 4 and the C-MOS inverter 6 are sequentially stably operated in this order. Then, at a time $t_2$ after the time $t_1$ by a predetermined period T, the C-MOS inverter 6 produces an amplified pulse width modulated signal shown in FIG. 5D.

Since the signal from the C-MOS inverter 6 shown in FIG. 5D is applied through the terminal 16 to the set signal input terminal S of the flip-flop circuit 15 as described above, at the time $t_2$ the flip-flop circuit 15 is set, namely is made to be in a state such that the high level signal "1" such as $+V_{CC}$ is produced at its output terminal Q and the low level signal "0" such as $-V_{CC}$ is obtained at its inverted output terminal $\overline{Q}$.

At this time, since the MOS FETs 10p and 10n of the transfer gate circuit 10, which forms the connection switch S1, are supplied with the low level signal "0" and the high level signal "1", respectively, the transfer gate circuit 10 is made conductive, that is, the connection switch S1 becomes the conductive state. While, at this time the MOS FETs 11p and 11n of the transfer gate circuit 11, which makes up the connection switch S2, are supplied with the high level signal "1" and the low level signal "0" so that the transfer gate circuit 11 is not made to be in the conductive state that is, the connection switch S2 is non-conductive.

As set forth, since at the time $t_2$ the connection switch S1 is in the conductive state but the connection switch S2 is in the non-conductive state, from the time $t_2$ the output signal from the C-MOS inverter 6 is supplied to the inverted input terminal of the operational amplifier 2a forming the integrator 2 through the resistor 9 to thereby apply a normal feedback thereto. Accordingly, the normal operation applied with the negative feedback is initiated after the time $t_2$.

As described above, according to the pulse width modulated signal amplifier of the invention, the negative feedback path through which the output signal from, for example, C-MOS inverter 6, which forms the amplifier, is supplied to the input side of the integrator 2 is cut-off during the predetermined period T after the power is supplied, so as not to supply an unstable output signal from the C-MOS inverter 6 and so on to the input side of the integrator 2. Therefore, no self-oscillation is generated in the closed loop including the integrator of the invention when the power is applied so that noise or so-called pop noise caused by the self-oscillation is not generated.

In the example of the invention described above, during the predetermined period T after the supply of power, the connection switch S2 is made conductive to apply the local feedback to the integrator 2, so that the integrator 2 operate stably even during this period T.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

I claim as my invention:

1. A pulse width modulated signal amplifier comprising: a power source for supplying a DC voltage; an input terminal for receiving an input signal to be pulse width modulated; an integrator having input and output terminals; a carrier signal oscillator for supplying a carrier signal; circuit means for supplying said input signal and said carrier signal to the input terminal of said integrator; a comparator having input and output terminals with the input terminal connected to the output terminal of said integrator and the output terminal producing a pulse width modulated signal; an output amplifier supplied with a DC voltage from said power source and having input and output terminals, the input terminal connected to the output terminal of said comparator and the output terminal producing an amplified pulse width modulated signal; and a negative feedback circuit connected between the input terminal of said integrator and the output terminal of said output amplifier and including a series connection of a feedback impedance and a first switching means, the first switching means being conductive after a predetermined time from the time when the DC voltage from said power source is supplied to said output amplifier so as to prevent oscillations.

2. A pulse width modulated signal amplifier according to claim 1, in which said feedback impedance comprises a resistor and said first switching means comprises a first ON-OFF switch.

3. A pulse width modulated signal amplifier according to claim 1, in which said output amplifier comprises a pair of complementary MOS field effect transistors connected as an inverter.

4. A pulse width modulated signal amplifier according to claim 3, further including a local negative feedback loop between the input and output terminals of said integrator.

5. A pulse width modulated signal amplifier according to claim 4, in which said local negative feedback loop includes a series connection of an impedance and a second switching means.

6. A pulse width modulated signal amplifier according to claim 5, in which said second switching means comprises a second ON-OFF switch.

7. A pulse width modulated signal amplifier according to claim 6, in which said second ON-OFF switch is on when said first ON-OFF switch is off and vice versa.

8. A pulse width modulated signal amplifier according to claim 7, in which said first ON-OFF switch comprises a pair of terminals; a first p-channel MOS field effect transistor having gate, source and drain electrodes; and a first n-channel MOS field effect transistor having gate, source and drain electrodes; the source electrodes of said first p-channel and n-channel MOS field effect transistors being connected to each other and to one of said pair of terminals, the drain electrodes of said first p-channel and n-channel MOS field effect transistors being connected to each other and to the other of said pair of terminals and said gate electrodes of said first p-channel and n-channel MOS field effect transistors being supplied with a pair of control signals with different polarities to connect and disconnect the pair of terminals.

9. A pulse width modulated signal amplifier according to claim 8, in which said second ON-OFF switch comprises a second pair of terminals; a second p-channel MOS field effect transistor having gate, source and drain electrodes; and a second n-channel MOS field effect transistor having gate, source and drain electrodes; the source electrodes of said second p-channel and n-channel MOS field effect transistors being connected to each other and to one of said second pair of terminals, the drain electrodes of said second p-channel and n-channel MOS field effect transistors being connected to each other and to the other of said second pair of terminals, and the gate electrodes of said second p-channel and n-channel MOS field effect transistors being supplied with a pair of control signals with different polarities to connect and disconnect said second pair of terminals.

10. A pulse width modulated signal amplifier according to claim 9, further including a gate control circuit to cause said first p-channel and said first n-channel MOS field effect transistors to conduct and to cut off said second p-channel and said second n-channel MOS field effect transistors.

11. A pulse width modulated signal amplifier according to claim 10, in which said gate control circuit comprises:

a flip-flop circuit having set, reset input terminals and non-inverted, inverted terminals;

circuit means for connecting the set input terminal of said flip-flop circuit to the output terminal of said output amplifier and connecting the reset terminal of said flip-flop circuit to said power source;

circuit means for connecting the non-inverted output terminal to the gate electrode of said first p-channel MOS field effect transistor through a first inverter and to the gate electrode of said first n-channel MOS field effect transistor through said first inverter and a second inverter;

circuit means for connecting the inverted output terminal to the gate electrode of said second p-channel MOS field effect transistor through a third inverter, and to the gate electrode of said second n-channel field effect transistor through said third inverter and a fourth inverter.

12. A pulse width modulated signal amplifier according to claim 11, further including a reset pulse generator connected between said power source and the reset terminal of said flip-flop circuit.

13. A pulse width modulated signal amplifier according to claim 12, in which said reset pulse generator comprises:

and AND gate circuit having a pair of input terminals and an output terminal, one of the pair of input terminals connected to said power source directly, the other of the pair of input terminals connected to said power sources through a delay circuit, and the output terminal connected to the reset terminal of said flip-flop circuit.

14. A pulse width modulated signal amplifier according to claim 13, in which said delay circuit comprises a plurality of inverters connected in series.

* * * * *